United States Patent
Yamamoto et al.

(10) Patent No.: US 8,037,890 B2
(45) Date of Patent: Oct. 18, 2011

(54) SUBSTRATE CLEANING DEVICE AND SUBSTRATE CLEANING METHOD

(75) Inventors: Taro Yamamoto, Kumamoto-Ken (JP); Hideharu Kyouda, Koshi (JP); Tetsu Kawasaki, Nirasaki (JP); Satoru Shimura, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 327 days.

(21) Appl. No.: 11/509,737

(22) Filed: Aug. 25, 2006

(65) Prior Publication Data

US 2007/0044823 A1  Mar. 1, 2007

(30) Foreign Application Priority Data

Aug. 30, 2005  (JP) .................................. 2005-249613

(51) Int. Cl.
*B08B 3/00* (2006.01)

(52) U.S. Cl. ...................... 134/94.1; 134/95.1; 134/95.2; 134/95.3; 134/36; 134/33; 134/103.2; 134/148; 134/157

(58) Field of Classification Search ........ 134/91.4–95.3, 134/148, 33, 94.1, 103.2, 95.3, 157, 36
See application file for complete search history.

(56) References Cited

U.S. PATENT DOCUMENTS

| | | | | |
|---|---|---|---|---|
| 5,783,495 A | * | 7/1998 | Li et al. | 438/738 |
| 5,962,070 A | * | 10/1999 | Mitsuhashi et al. | 427/240 |
| 6,062,240 A | * | 5/2000 | Sada et al. | 134/95.2 |
| 6,770,151 B1 | * | 8/2004 | Ravkin et al. | 134/33 |
| 2001/0040229 A1 | * | 11/2001 | Schroder | 251/309 |
| 2001/0042559 A1 | * | 11/2001 | Mertens et al. | 134/31 |
| 2002/0035762 A1 | * | 3/2002 | Okuda et al. | 15/77 |
| 2002/0148483 A1 | * | 10/2002 | Mertens et al. | 134/1.3 |
| 2003/0000034 A1 | * | 1/2003 | Welsh et al. | 15/77 |
| 2006/0256316 A1 | * | 11/2006 | Tanno et al. | 355/72 |
| 2007/0052942 A1 | | 3/2007 | Tanno et al. | |

FOREIGN PATENT DOCUMENTS

| | | | |
|---|---|---|---|
| JP | 2001-053051 | * | 2/2001 |
| JP | 2002-057088 | | 2/2002 |
| JP | 2004-207469 | | 7/2004 |
| JP | 09-306884 | | 11/2007 |
| WO | 2005/036623 A1 | | 4/2005 |

* cited by examiner

*Primary Examiner* — Michael Kornakov
*Assistant Examiner* — Katelyn Whatley
(74) *Attorney, Agent, or Firm* — Oblon, Spivak, McClelland, Maier & Neustadt, L.L.P.

(57) ABSTRACT

A substrate cleaning device and a substrate cleaning method reduces liquid drops remaining on a substrate to prevent the irregular heating of the substrate by a heating process due to liquid drops or water marks remaining on the substrate. A cleaning liquid is poured through a cleaning liquid pouring nozzle onto the surface of a substrate such that a region onto which the cleaning liquid is poured moves from a central part toward the circumference of the substrate. A gas is jetted radially outward at a region on the surface of the substrate behind a region onto which the cleaning liquid is poured with respect to the rotating direction of the substrate. The gas forces a liquid film of the cleaning liquid flowing on the surface of the substrate to flow in a circumferential direction and a radially outward direction.

6 Claims, 15 Drawing Sheets

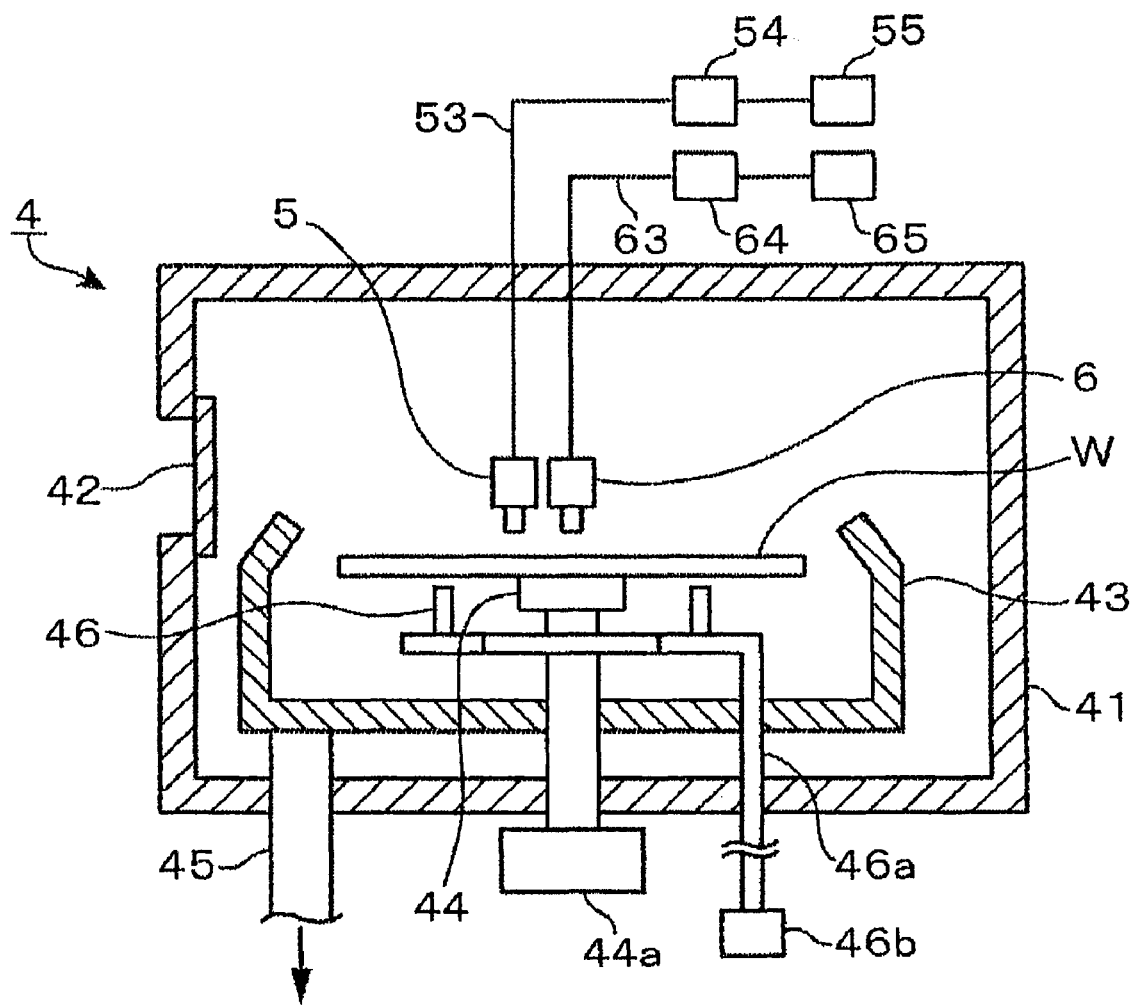
F I G. 3

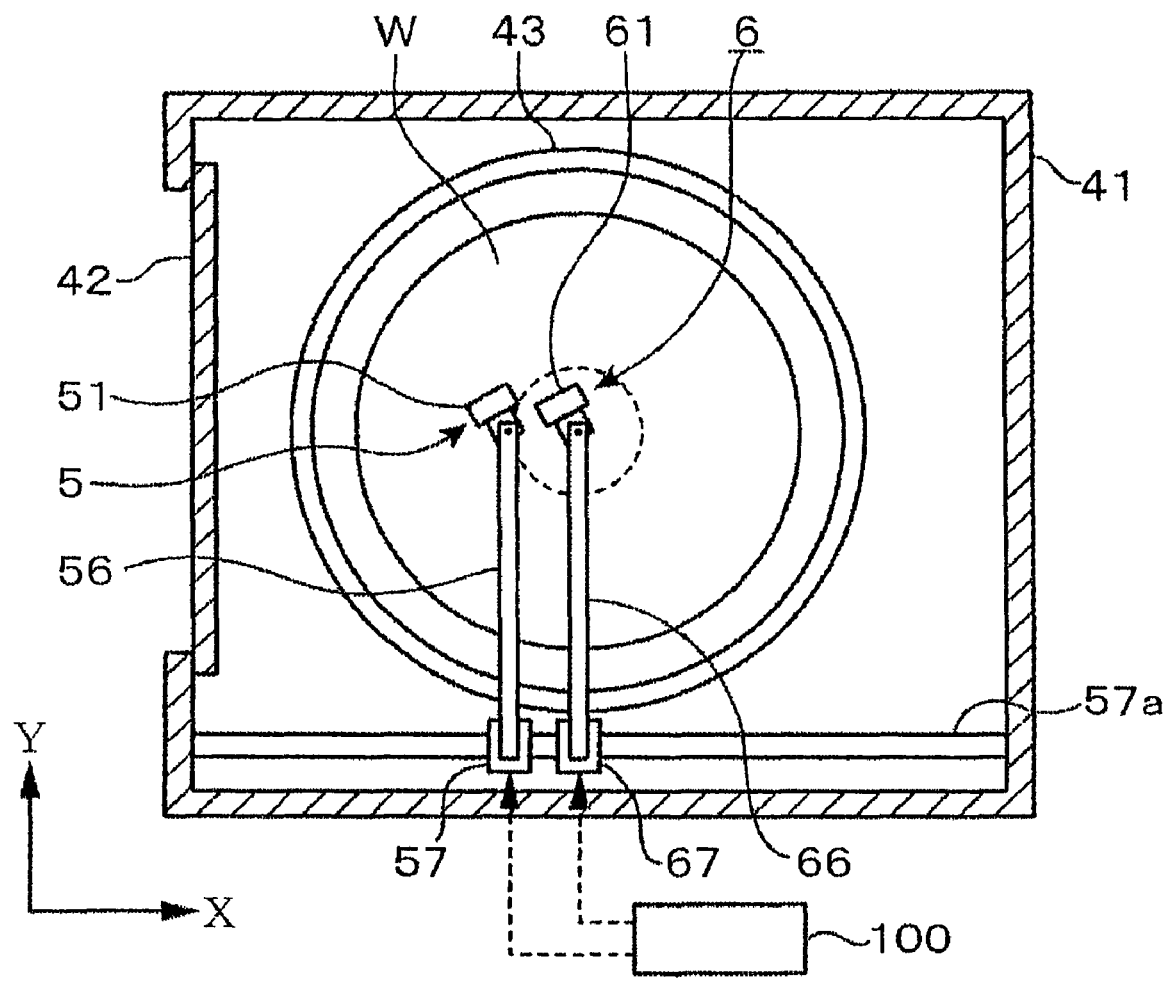
F I G. 4

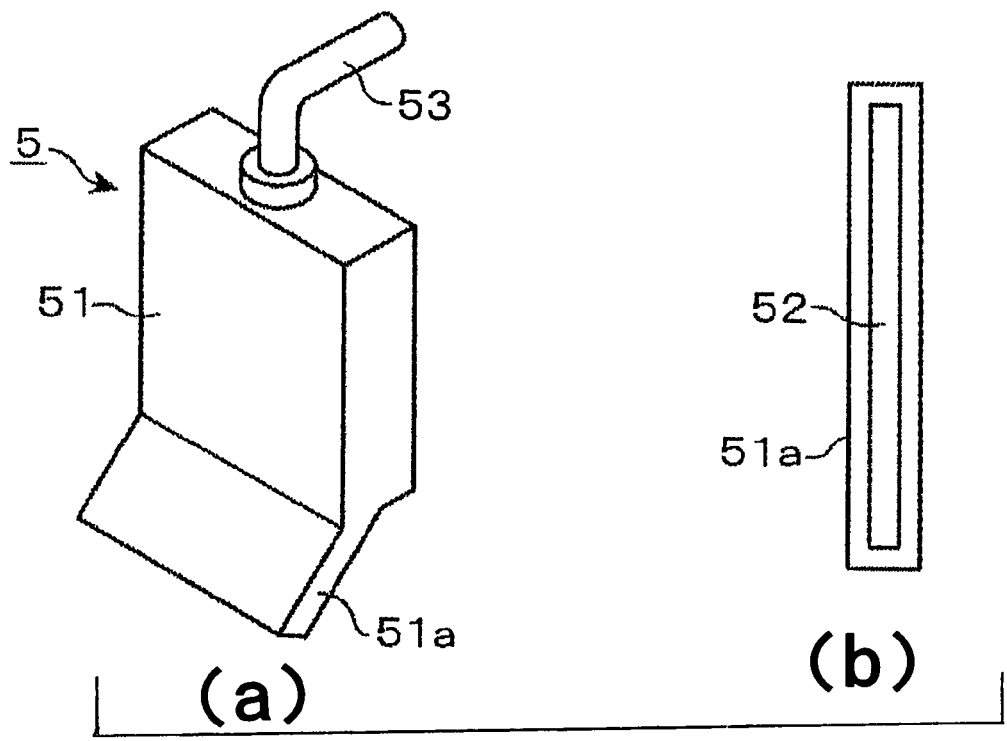
F I G. 5
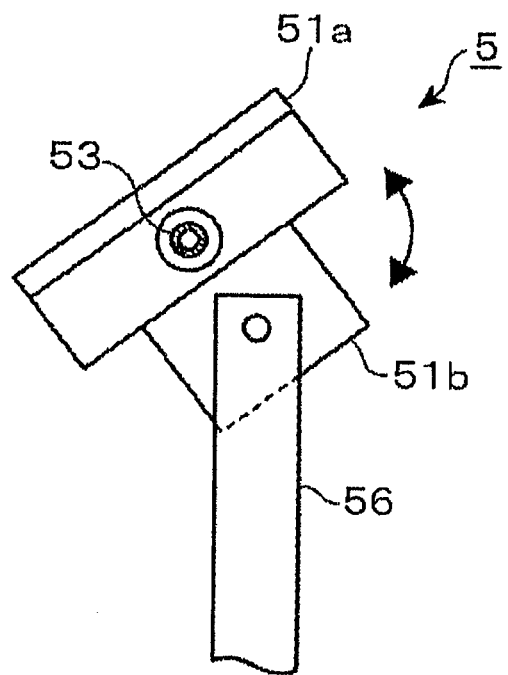
F I G. 6

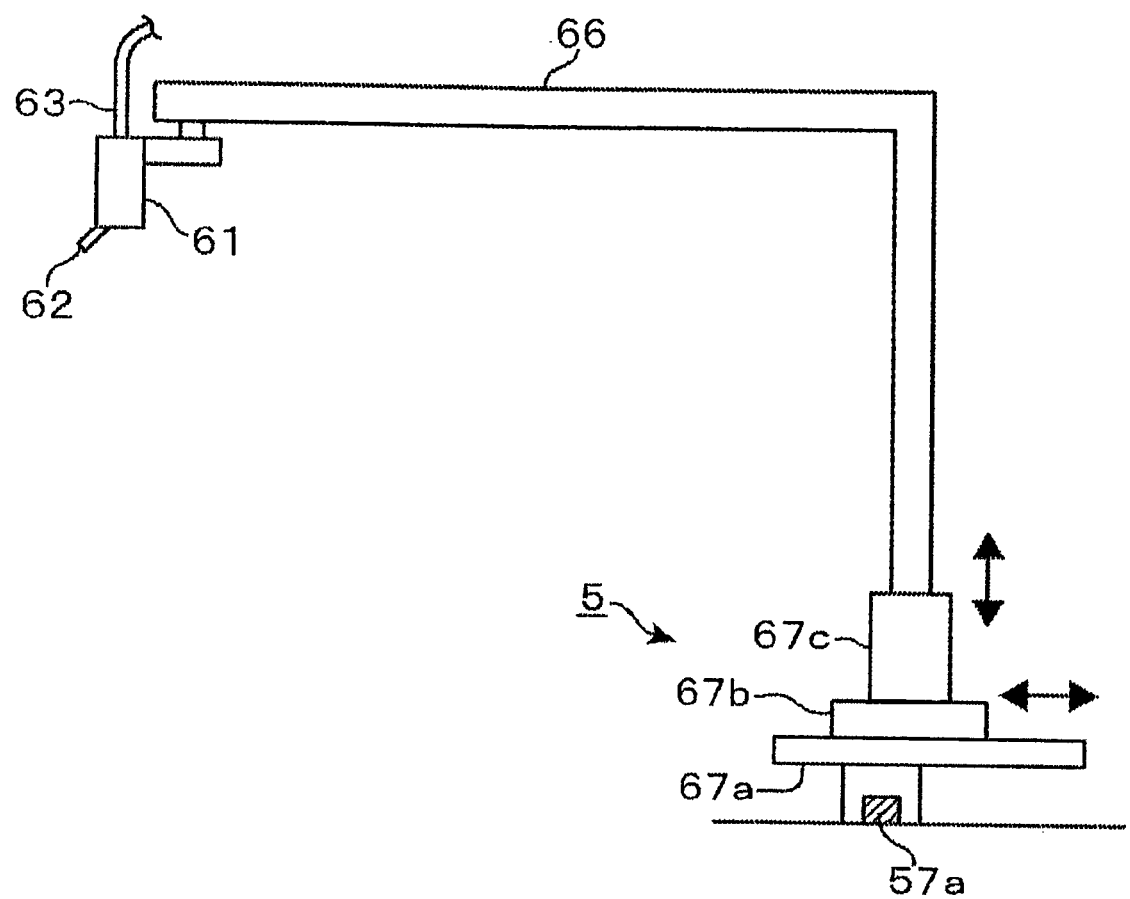
F I G. 7

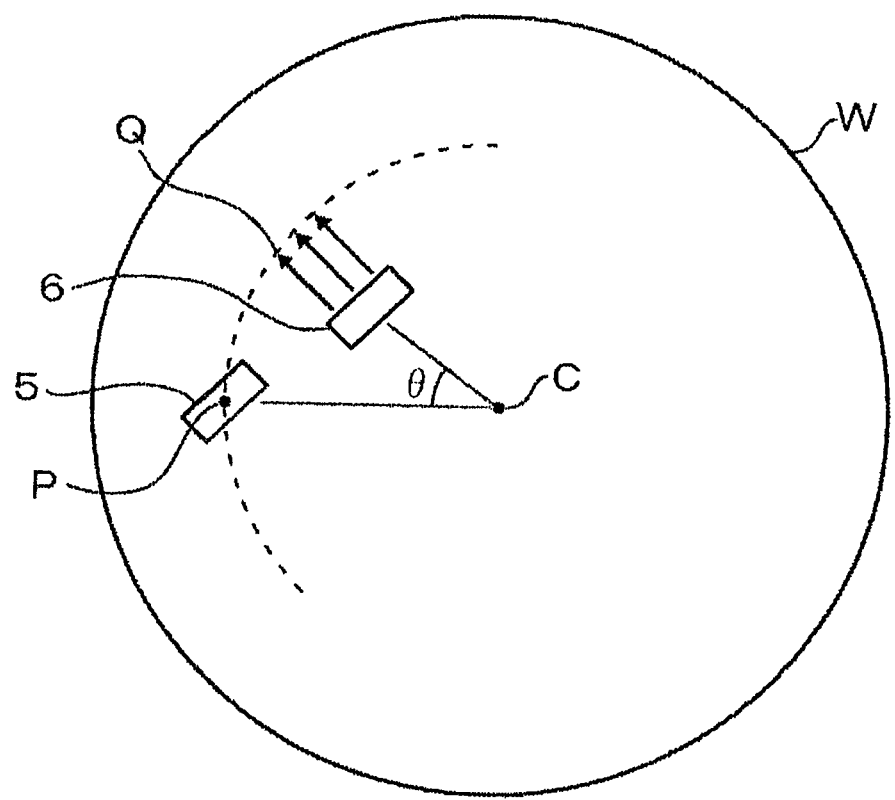
F I G. 9

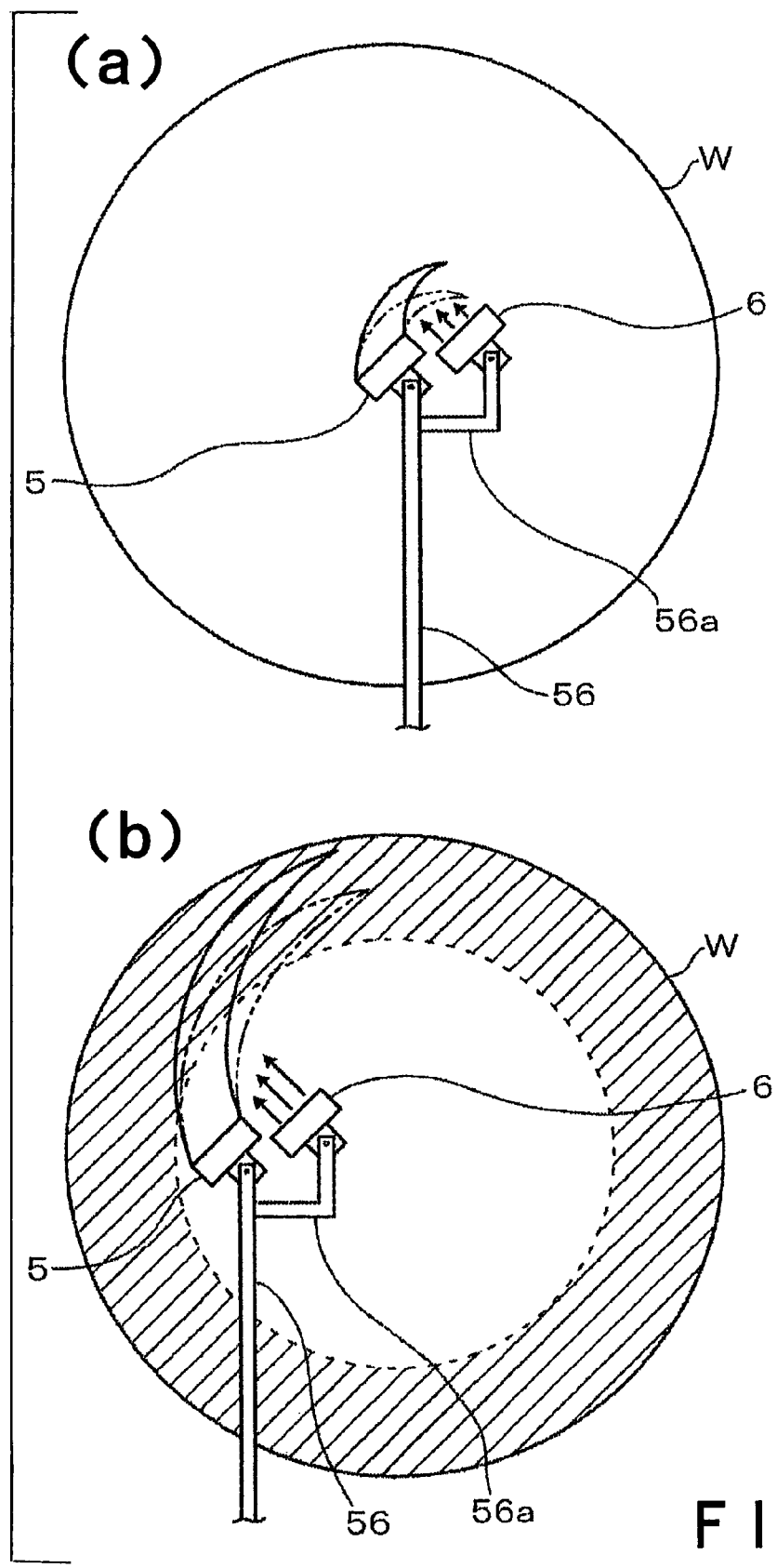
F I G. 10

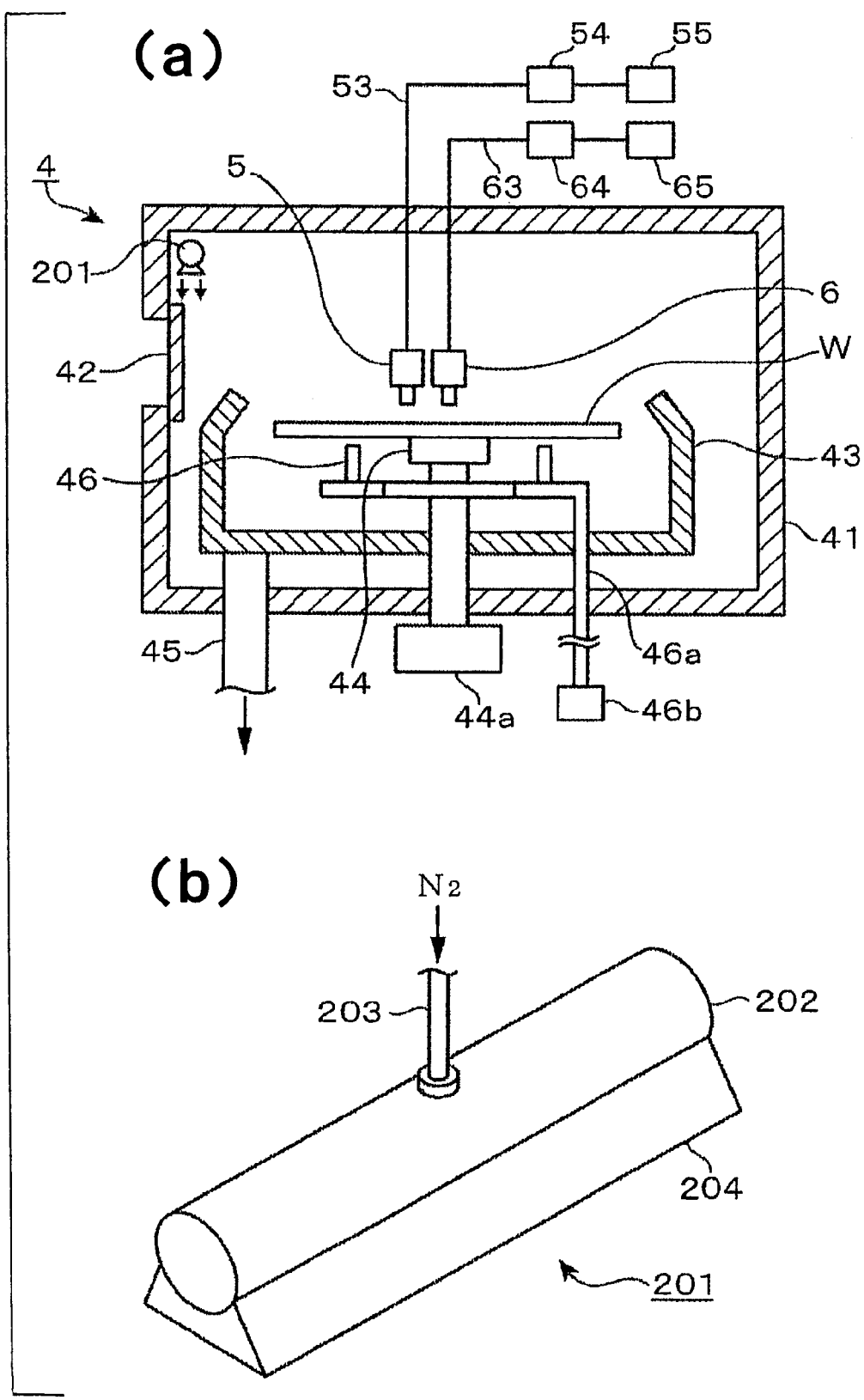
F I G. 12

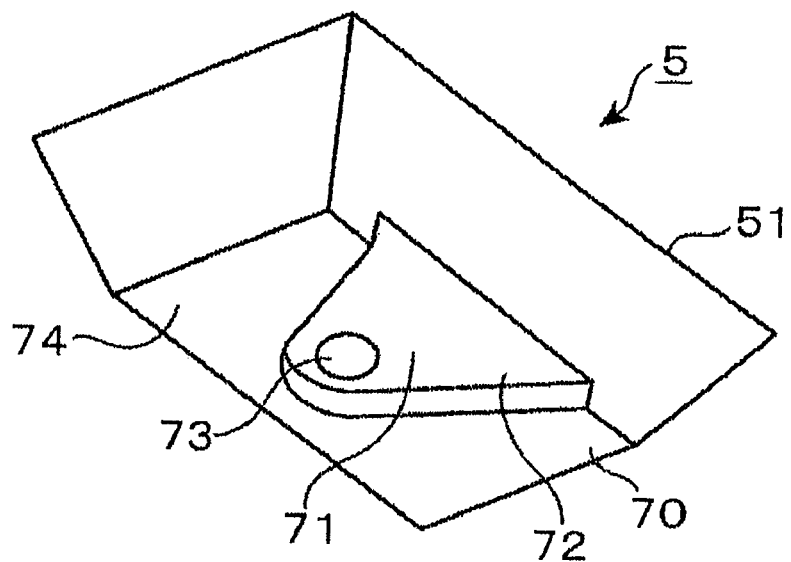
F I G. 13
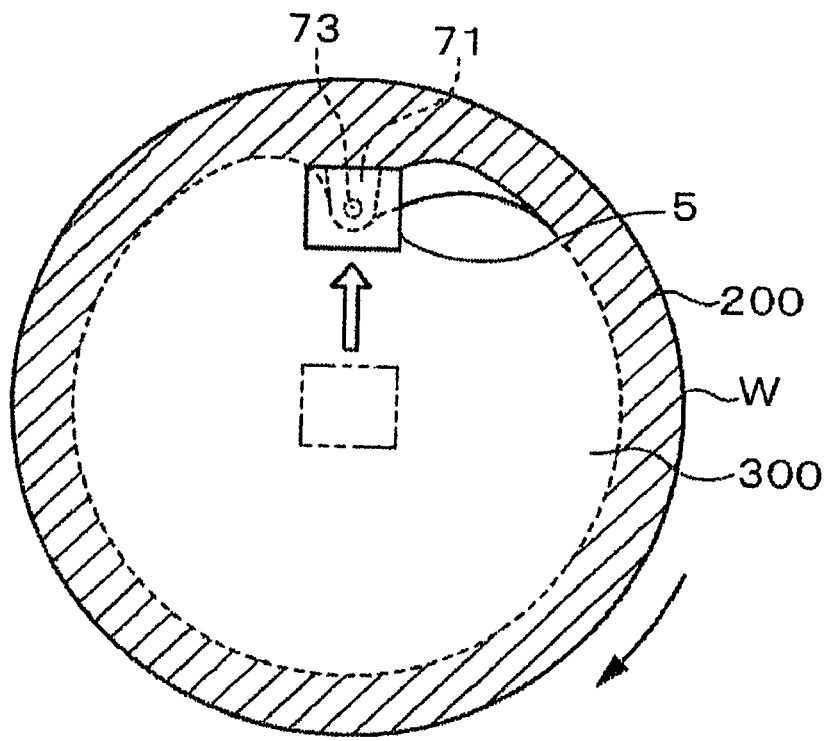
F I G. 14

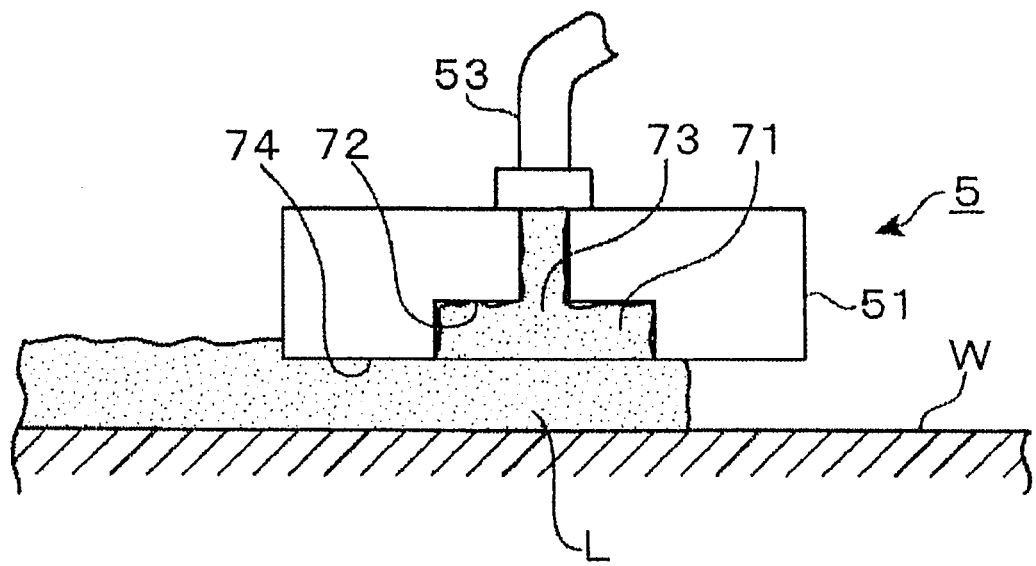
F I G. 15

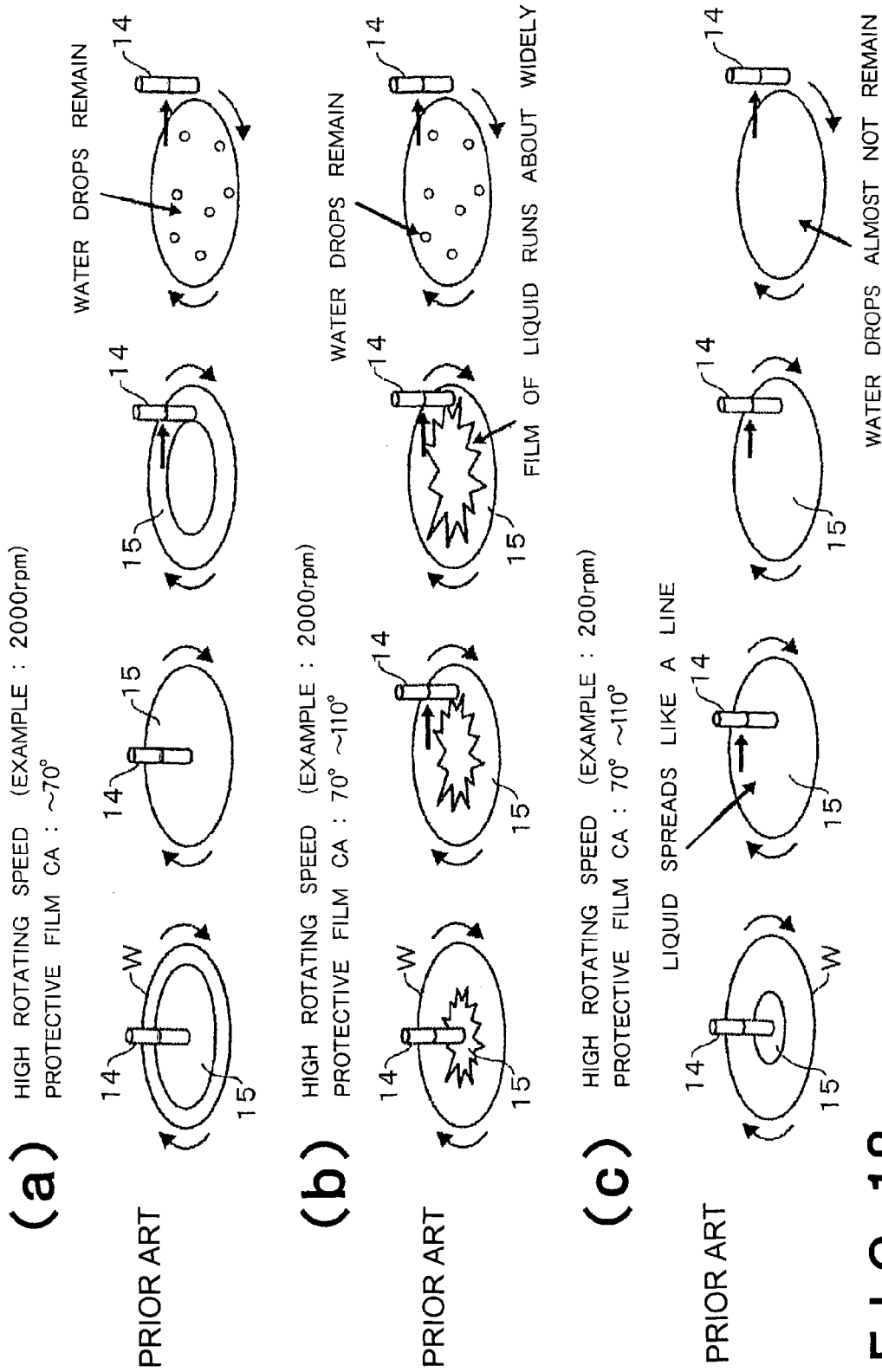
F I G. 18

SUBSTRATE CLEANING DEVICE AND SUBSTRATE CLEANING METHOD

BACKGROUND OF THE INVENTION

1. Field of the Invention

The present invention relates to a substrate cleaning device for cleaning a surface of a substrate processed by, for example, an emersion exposure process or a developing process, and a substrate cleaning method to be carried out by the substrate cleaning device.

2. Description of the Related Art

A photoresist pattern forming process, which is one of semiconductor device fabricating processes, coats a surface of a semiconductor wafer (hereinafter, referred to simply as "wafer") with a resist film, exposes the resist film in a predetermined pattern, and develops the exposed resist film to form a resist pattern.

Device patterns have been progressively miniaturized and the thickness of films shows a trend to decrease in recent years. Consequently, there has been a growing request for higher exposure resolution. To improve exposure resolution, efforts have been made to develop exposure techniques, such as an exposure method using extreme ultraviolet rays (EUVL), an exposure method using electron beam projection (EPL) and an exposure method using a fluorine dimer ($F_2$). On the other hand, an immersion exposure method has been studied to achieve higher resolution through the further improvement of exposure techniques using a conventional light source, such as a light source of argon fluoride (ArF) or krypton fluoride (KrF). The immersion exposure method passes light through, for example, pure water to use the effect of water to shorten the wavelength of radiation emitted by an ArF light source from 193 nm to 134 nm. The immersion exposure method can achieve high resolution by using an existing light source.

The immersion exposure method will be briefly described with reference to FIG. 16. An exposure device 1 is placed opposite to a surface of a wafer W. The exposure device 1 is provided on its head with a lens 10. The head of the exposure device 1 is provided in a part near the periphery of the lens 10 with a pouring hole 11 through which a liquid, such as pure water, for forming a liquid layer on the surface of the wafer W is poured, and a suction hole 12 through which pure water poured onto the wafer W is recovered by suction. Pure water is poured through the pouring hole 11 onto the surface of the wafer W to form a water film between the lens 10 and the surface of the wafer W. The pure water wetting the surface of the wafer W is recovered by sucking the pure water through the suction hole 12. Thus a liquid film, namely, the pure water film, is formed between the lens 10 and the surface of the wafer W. A resist film formed on the surface of the wafer W is irradiated with radiation emitted by a light source, not shown, and traveled through the lens 10 and the liquid film to form a latent image of a predetermined circuit pattern in the resist film.

Then as shown in FIG. 17, the wafer W coated with the water film is translated to align the next transfer range (shot range) 13 in the surface of the wafer W with the exposure device 1. An exposure cycle is thus repeated to transfer the predetermined circuit pattern repetitively to the resist film formed on the surface of the wafer W. In FIG. 17, shot regions 13 are shown in a size greater than their actual size.

The possibility that the wafer wetted with water drops is carried from an exposure system to a coating and developing system is a problem in the immersion exposure method. The wafer W processed by an exposure process is subjected to a heat treatment. If the wafer W is wetted with water drops or if water drops have dried and watermarks are formed on the wafer W in the heat treatment, the water drops or the watermarks affect adversely to the resolution of parts of the circuit pattern underlying the water drops or the watermarks. Therefore, the surface of the wafer needs to be cleaned after exposure to remove water drops.

However, the following problems arise in cleaning the wafer processed by the immersion exposure process. Studies have been made to form a highly water-repellent protective film that come into contact with, for example, water at a contact angle between about 70° and about 100° to assure throughput comparable top that of the known exposure system by enhancing the scanning follow-up ability of the immersed part of the exposure device (the head of the lens). However, the high repellency of the protective film increases the possibility of water drops remaining on the protective film.

As generally known, a cleaning unit for cleaning a wafer W is combined with a developing unit. Generally, the cleaning unit cleans the wafer W by a spin cleaning method that rotates a wafer W while a cleaning liquid is poured onto a central part of the wafer W, and then spin-dries the wafer W. FIGS. 18(*a*), 18(*b*) and 18(*c*) typically illustrate changes of the state of a cleaning liquid while a wafer is cleaned by a spin cleaning method. FIG. 18(*a*) shows a state of a wafer when the contact angle between the surface of the wafer and water is 70° or below and the wafer is rotated at a high rotating speed of 2000 rpm. FIG. 18(*b*) shows a state of a wafer when the contact angle between the surface of the wafer and water is between 70° and 110° and the wafer is rotated at a high rotating speed of 2000 rpm. FIG. 18(*c*) shows a state of a wafer when the contact angle between the surface of the wafer and water is between 70° and 110° and the wafer is rotated at a low rotating speed of 200 rpm.

In FIG. 18(*a*), a cleaning liquid 15 poured through a nozzle 14 onto a central part of a wafer W spreads toward the circumference of the wafer W and covers the surface of the wafer W entirely. Then, the nozzle 14 is moved toward the circumference of the wafer W to expand a dry region on the surface of the wafer W gradually from a central part toward the circumference of the wafer W. Even if the surface of the wafer W is not highly repellent, it is difficult to remove water drops completely from the surface of the wafer W. In other words, the adjustment of parameters including the rate of pouring the cleaning liquid, the moving speed of the nozzle 14 and the rotating speed of the wafer W is considerably difficult. When the surface of the wafer W has high repellency as shown in FIG. 18(*b*), a film of the cleaning liquid 15 runs about wildly when the cleaning liquid 15 spreads from a central part toward a circumferential part of the surface of the wafer W and a dry region in the surface of the wafer W expands radially outward. Consequently, a cleaning liquid film breaks and cleaning liquid drops cannot be easily removed, i.e., cleaning liquid drops do not roll radially outward on the wafer W. Consequently, the cleaning liquid drops cannot be completely removed even if the parameters are adjusted.

When the wafer W is rotated at a low rotating speed as shown in FIG. 18(*c*), the cleaning liquid poured through the nozzle 14 onto the wafer W moves radially outward at a low speed. Therefore, the nozzle 14 unavoidably needs to be moved at a low moving speed and processing speed is unavoidably low. Since the wafer W is rotated at a low rotating speed and centrifugal force that acts on the cleaning liquid poured onto the wafer W is low, the cleaning liquid poured onto the wafer W is splashed in all directions and, eventually, the cleaning liquid remains in drops on the wafer W in some cases.

The adjustment of the process parameters of the known spin cleaning process is difficult when the wafer is rotated at a high rotating speed. The adjustment of the process parameters becomes more difficult when the protective film is formed on the wafer because it is expected that different device makers use different types of protective films and contact angle between the protective film and the cleaning liquid changes with time. On the other hand, the cleaning process takes a long time and there is strong possibility of water drops remaining on the wafer when the wafer is rotated at a low rotating speed.

It is preferable to process a substrate coated with a film, such as a resist film or a protective film, by a cleaning process to remove substances contained in the film and capable of being eluted. However, the cleaning process needs to clean the substrate such that any small water drops do not remain on the surface of the substrate. If water drops exist on the surface of the substrate, the so-called water marks, namely, dehydrated stains, will be formed on the surface of the substrate before the substrate is transferred to the exposure unit and will cause defects during an exposure process. The protective film prevents a resist film from coming into contact with a liquid during an immersion exposure process or to enhance the repellency of the surface of the substrate.

An improved, known spin cleaning method proposed in JP-A 2001-53051 (p. 2, paragraphs 0036 and 0050) uses a gas nozzle for jetting an inert gas in addition to a nozzle for pouring a cleaning liquid. A gas is jetted through the gas nozzle at a region on which a cleaning liquid is poured so as to make the cleaning liquid flow outward. Since the gas is jetted simultaneously with pouring the cleaning liquid onto the region, the cleaning liquid poured on the region is splashed in liquid drops. The liquid drops remain on the substrate if the substrate is rotated at a low rotating speed because centrifugal force that acts on the liquid drops is low when the rotating speed is low.

SUMMARY OF THE INVENTION

The present invention has been made under such circumstances and it is therefore an object of the present invention to provide a substrate cleaning device and a substrate cleaning method capable of cleaning a substrate by a spin-cleaning process and of drying the substrate so that any water drops may not remain on the substrate or so that water drops remaining on the substrate may be reduced.

A substrate cleaning device in a first aspect of the present invention includes: a rotary substrate holding device for horizontally holding a substrate; a cleaning liquid pouring nozzle for pouring a cleaning liquid onto a surface of a substrate held on the rotary substrate holding device; a first driving device for moving the cleaning liquid pouring nozzle while the wafer is being rotated so that a region on a surface of the substrate onto which the cleaning liquid poured through the cleaning liquid pouring nozzle moves from a central part toward the circumference of the substrate; a gas nozzle for jetting a gas at a region behind a region onto which the cleaning liquid is poured with respect to a rotating direction in which the substrate is rotated to force the cleaning liquid poured through the cleaning liquid pouring nozzle onto the substrate to flow toward the circumference of the substrate; and a second driving device for moving the gas nozzle in synchronism with the movement of the cleaning liquid pouring nozzle.

Preferably, the cleaning liquid pouring nozzle has a nozzle exit inclined to the surface of the substrate so as to discharge the cleaning liquid toward the circumference of the substrate. Preferably, the nozzle exit of the cleaning liquid pouring nozzle extends parallel to the surface of the substrate. Concretely, the nozzle exit is a slit extending parallel to the surface of the substrate or a row of a plurality of pores parallel to the surface of the substrate. The first driving device may be separated from the second driving device or may serve also as the second driving device.

Preferably, the gas nozzle or a gas supply line connected to the gas nozzle is provided with an ionizer (static eliminator) for ionizing a gas.

A substrate cleaning device in a second aspect of the present invention includes: a substrate holding device for horizontally holding a substrate; a cleaning liquid pouring nozzle for pouring a cleaning liquid onto a surface of the substrate held on the rotary substrate holding device; and a liquid restraining device disposed behind the nozzle exit of the cleaning liquid pouring nozzle with respect to a rotating direction in which the substrate is rotated at a height equal to or lower than a height at which the nozzle exit is held to restrain the cleaning liquid poured through the cleaning liquid pouring nozzle.

A liquid damming member may be formed such that the height thereof decreases in the rotating direction in which the substrate is rotated or may have a first part at a first height and a second part at a second height lower than the first height.

A substrate may be cleaned by the present invention after the substrate has been processed by an immersion exposure process that subjects the substrate coated with a liquid to exposure and before the substrate is subjected to a heating process or after the substrate has been processed by a developing process. According to the present invention, a substrate is rotated at a rotating speed of, for example, 500 rpm or below. The substrate cleaning device in the first aspect of the present invention provided with the gas nozzle may be combined with the substrate cleaning device in the second aspect of the present invention provided with the damming member.

A substrate cleaning method according to the present invention includes the steps of: horizontally holding a substrate on a rotary substrate holding device; pouring a cleaning liquid onto a surface of the substrate while the rotary substrate holding device is rotated about a vertical axis so that a region onto which the cleaning liquid is poured moves from a central part toward the circumference of the substrate; and jetting a gas through a gas nozzle at a region behind the region onto which the cleaning liquid is poured with respect to a rotating direction in which the substrate is rotated to force the cleaning liquid poured through the cleaning liquid pouring nozzle onto the substrate to flow toward the circumference of the substrate.

Preferably, the substrate cleaning method according to the present invention further includes the step of restraining the cleaning liquid poured through the nozzle exit of the cleaning liquid pouring nozzle onto the surface of the substrate and flowing in a direction opposite the rotating direction of the substrate by a liquid damming member disposed at a height equal to or lower than that of the nozzle exit.

Another substrate cleaning method according to the present invention includes the steps of: horizontally holding a substrate on a substrate holding device; pouring a cleaning liquid onto a surface of the substrate while the rotary substrate holding device is rotated about a vertical axis so that a region onto which the cleaning liquid is poured moves from a central part toward the circumference of the substrate; and restraining the cleaning liquid poured through the nozzle exit of the cleaning liquid pouring nozzle onto the surface of the substrate and flowing in a direction opposite the rotating direction in which the substrate is rotated by a liquid damming member disposed at a height equal to or lower than that of the nozzle exit of the liquid pouring nozzle.

According to the present invention, the region onto which the cleaning liquid is poured is moved from the central part toward the circumference of the substrate and the gas is jetted at a region behind the region onto which the cleaning liquid is poured with respect to the rotating direction of the substrate. Consequently, the gas jetted at the substrate exerts an outward force on a liquid film of the cleaning liquid poured onto the substrate and the cleaning liquid flowing in a circumferential direction is caused to flow outward. Therefore, a dry region in a surface of the substrate expands rapidly outward even if the substrate is rotated at a low rotating speed that will not cause the cleaning liquid run wildly, the cleaning liquid will not stagnate at a radial position, drops of the cleaning liquid can be surely removed and a cleaning process can be quickly completed.

According to the present invention, the flow of the cleaning liquid poured through the cleaning liquid pouring nozzle onto the surface of the substrate is restrained from flowing by the liquid damming member disposed at a height equal to or lower than the height of the nozzle exit of the liquid pouring nozzle. Consequently, the cleaning liquid collects in a large mass near the liquid damming member and an increased centrifugal force acts radially outward on the cleaning liquid, the cleaning liquid will not stagnate at a radial position, drops of the cleaning liquid can be surely removed and a cleaning process can be quickly completed.

BRIEF DESCRIPTION OF THE DRAWINGS

FIG. 3 is a longitudinal sectional view of the substrate cleaning device in the first embodiment;

FIG. 4 is a schematic plan view of the substrate cleaning device in the first embodiment;

FIG. 5 is a perspective view of a cleaning liquid pouring nozzle included in the substrate cleaning device in the first embodiment;

FIG. 6 is a plan view of the cleaning liquid pouring nozzle shown in FIG. 5;

FIG. 7 is a side elevation of a gas nozzle and a gas nozzle driving mechanism;

FIG. 9 is a view of assistance in explaining the positional relation between the cleaning liquid pouring nozzle and the gas nozzle during a cleaning process for cleaning a wafer;

FIG. 10 is a view of assistance in explaining a cleaning process using a substrate cleaning device in a modification of the first embodiment;

FIGS. 12(a) and 12(b) are a longitudinal sectional view of the substrate cleaning device in the first embodiment provided with a gas jetting device provided with an ionizer and disposed at a gate and a perspective view of the gas jetting device, respectively;

FIG. 13 is a bottom perspective view of a cleaning liquid pouring nozzle included in a substrate cleaning device in a second embodiment according to the present invention;

FIG. 14 is a plan view of assistance in explaining the positional relation between a cleaning liquid pouring nozzle and wafer in the substrate cleaning device in the second embodiment;

FIG. 15 is a sectional view of assistance in explaining the function of the cleaning liquid pouring nozzle included in the second embodiment to restrain a cleaning liquid;

FIGS. 18(a), 18(b) and 18(c) are views typically illustrating changes of the state of a cleaning liquid while on a wafer while the wafer is cleaned by a spin cleaning method.

DESCRIPTION OF THE PREFERRED EMBODIMENTS

Figure 1:
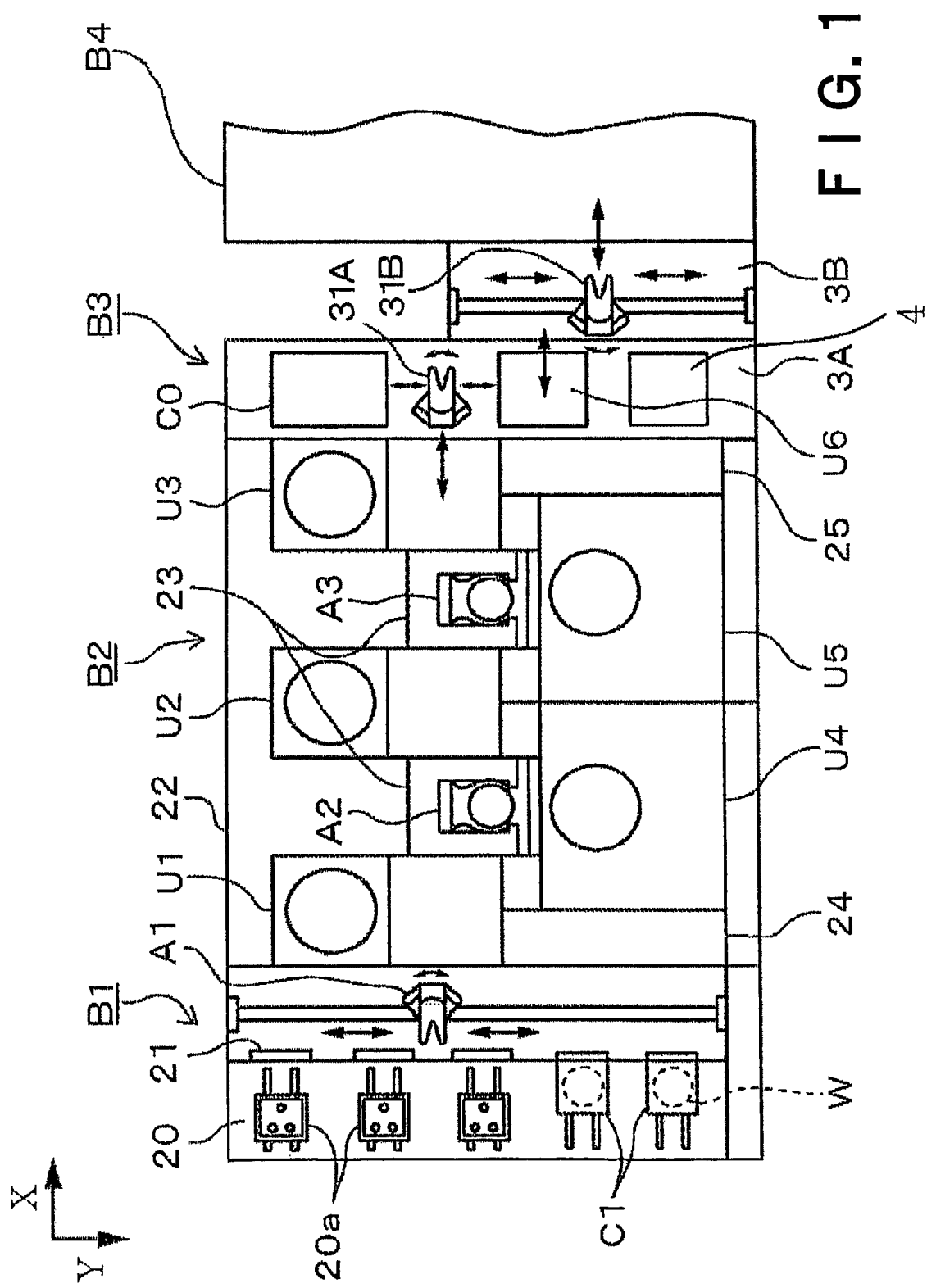
FIG. 1 is a plan view of a coating and developing system provided with a substrate cleaning device in a first embodiment according to the present invention.
Figure 2:
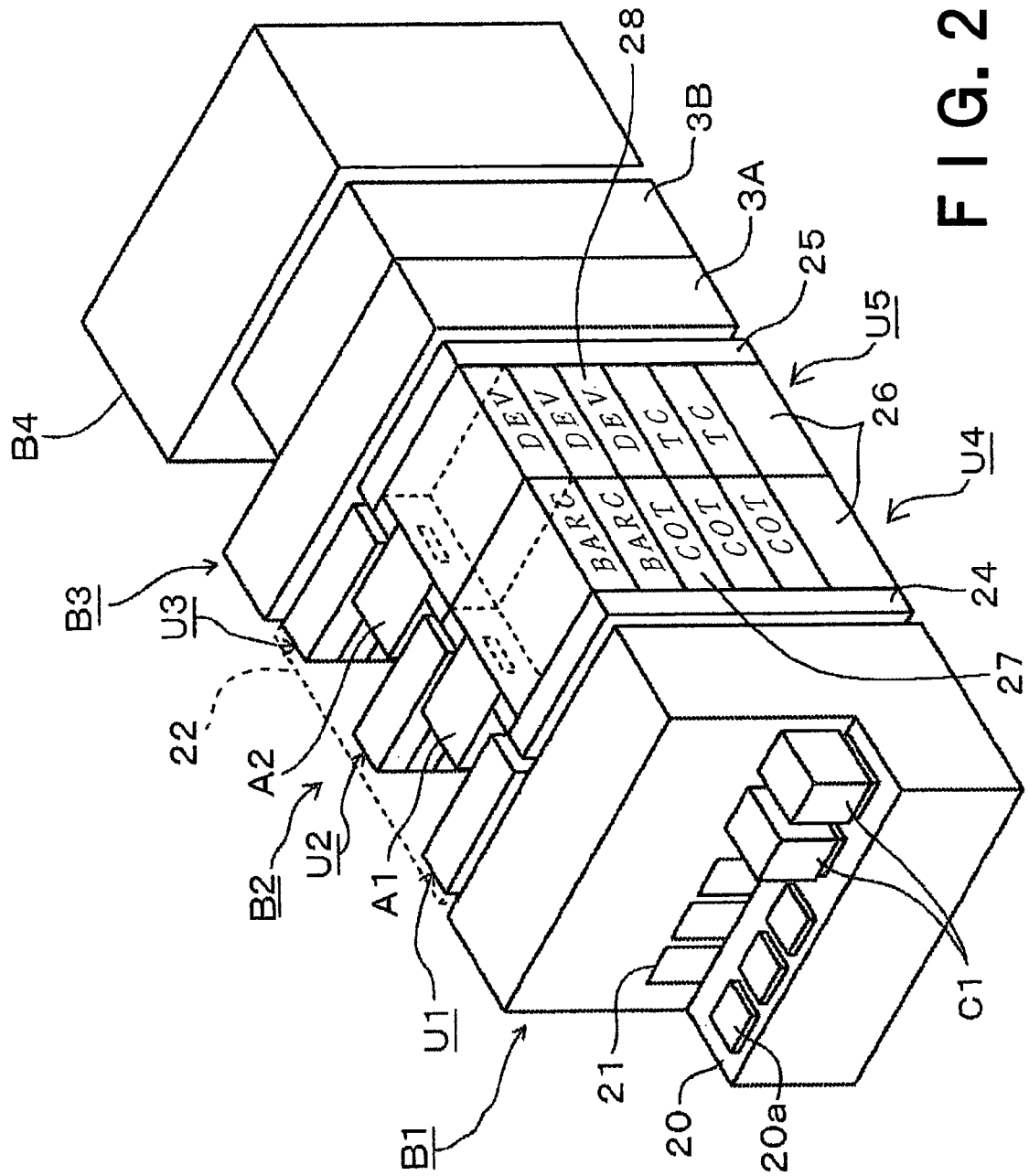
FIG. 2 is a perspective view of the coating and developing system.

A substrate cleaning device in a preferred embodiment according to the present invention will be briefly described with reference to FIGS. 1 and 2 as applied to an immersion exposure system. The immersion exposure system is built by connecting an exposure system to a coating and developing system. Referring to FIGS. 1 and 2, a carrier handling block B1 includes a carrier station 20 provided with carrier support tables 20a for supporting airtight carriers C1 thereon, respectively, gates 21 formed in a wall behind the carrier support table 20a, and a transfer device A1 capable of extending through the gate 21 to take out a wafer W from the carrier C1. The carrier C1 contains, for example, thirteen wafers W, namely, substrates.

A processing block B2 surrounded by a casing 22 is connected to the back end of the carrier handling block B1. The processing block B2 includes three shelf units U1, U2 and U3 each formed by stacking up heating and cooling systems in layers, liquid-processing units U4 and U5, and main carrying devices A2 and A3 for carrying a wafer W from and to the component units of the liquid-processing units U4 and U5. The shelf units U1, U2 and U3 and the main carrying devices A2 and A3 are arranged alternately. As viewed from the side of the carrier handling block B1, the shelf units U1, U2 and U3 are arranged in a longitudinal row in a left part of the processing block B2 and the liquid-processing units U4 and U5 are disposed in a right part of the processing block B2. The main carrying device A2 is placed in a space defined by the opposite side surfaces of the shelf units U1 and U2, the inner side surface of the liquid-processing unit U4 and a back wall 23. The main carrying device A3 is placed in a space defined by the opposite side surfaces of the shelf units U2 and U3, the inner side surface of the liquid-processing unit U5 and a back wall 23. Temperature and humidity control units 24 and 25 include temperature controllers for controlling the temperatures of processing liquids used by the units, and ducts for air conditioning.

Referring to FIG. 2, the liquid-process units U4 and U5 are built by stacking up, for example, coating units (COT) 27, developing units (DEV) 28 and antireflection film forming units BARC and such in, for example, five layers. The shelf units U1, U2 and U3 are built by stacking processing units that process a wafer by pretreatment processes before the wafer is processed by the liquid-processing units U4 and U5 and by posttreatment processes after the wafer has been processed by the liquid-processing units U4 and U5, respectively, in, for example, ten layers. The processing units included in each of the shelf units U1, U2 and U3 include heating units (baking units) for heating a wafer W and cooling units for cooling a wafer W An interface block B3 is disposed behind the shelf unit U3 of the processing block B2, and a developing system B4 is connected to the interface block B3. As shown in FIG. 1, the interface block B3 includes a first transfer chamber 3A and a second transfer chamber 3B longitudinally arranged between the processing block B2 and the exposure system B4. A first substrate carrying device 31A and a second substrate carrying device 31B are placed respectively in the transfer chambers 3A and 3B. A shelf unit U6, a buffer cassette CO and a substrate cleaning system 4 of the present invention are disposed in the first transfer chamber 3A. The shelf unit U6 is built by stacking up a heating unit PEB for heating a wafer W processed by an exposure process, a precision temperature adjusting unit provided with a cooling plate and such.

The flow of a wafer W in this system will be briefly described. A carrier C1 holding wafers W is delivered to the carrier station 20 and is mounted on the carrier support table 20a. The gate 21 is opened and the lid of the carrier C1 is removed. Then, the transfer device A1 takes out the wafer W from the carrier C1. Then, the wafer W is transferred through a transfer unit, not shown, included in the shelf unit U1 to the main carrying device A2. One of the units of the shelf units U1 to U3 processes the wafer W by, for example, a hydrophobicity imparting process and a temperature adjusting process by the cooling unit.

Subsequently, the main carrying device A2 carries the wafer W into the coating unit (COT) 27. A resist film is formed on the upper surface of the wafer W. A peripheral part of the resist film formed on the upper surface of the wafer, the side surface of the wafer W and a peripheral part of the lower surface of the wafer are coated with a water-repellent film, namely, a protective film. Then, the main carrying device A2 carries the wafer W to the heating unit. The heating unit processes the wafer W by a baking process to heat the wafer W at a predetermined temperature for baking.

The wafer W processed by the baking process is cooled by the cooling unit. Then, the wafer W is transferred through the transfer unit of the shelf unit U3 and the interface block B3 to the exposure system B4. As mentioned in connection with the description of the related art, the exposure device 1 is disposed opposite to the upper surface of the wafer W to process the wafer W by the immersion exposure process.

After the wafer W has been processed by the immersion exposure process, the second substrate carrying device 31B takes out the wafer W from the exposure system B4. Then, the substrate cleaning system 4 removes water drops from the surface of the wafer W. Then, the wafer W is carried into the heating unit (PEB) of the shelf unit U6. The heating unit processes the wafer W by a heating process. When the wafer W is subjected to the heating process, an acid-producing component contained in exposed parts of the resist film produces an acid and the acid diffuses in the resist film. Then, the resist forming the resist film undergoes a chemical reaction augmented by the acid. The chemical reaction makes the exposed parts soluble to a developer if the resist film is formed of a positive resist or insoluble to a developer if the resist film is formed of a negative resist.

Then, the first substrate carrying device 31A carries out the wafer W from the heating unit (PEB) and transfers the wafer W to the main carrying device A3. The main carrying device A3 carries the wafer W into the developing unit 28. In the developing unit 28, the water-repellent film formed on the wafer W is dissolved by a dissolving solution and then a developer is poured onto the surface of the wafer W to wet the surface of the wafer W uniformly. Parts soluble in the developer of the resist film dissolve in the developer and a resist mask of a predetermined pattern is formed on the surface of the wafer W. Then, the wafer W is returned into the carrier C1 supported on the carrier support table 20a.

The substrate cleaning system 4 in a first embodiment according to the present invention will be described with reference to FIG. 3 and the following drawings. Referring to FIGS. 3 and 4, the substrate cleaning system 4 has a case 41 provided with a gate closed by a shutter 42. A cup 43 is disposed in the case 41. A wafer holding device 44 provided with, for example, a vacuum chuck and capable of rotating about a vertical axis is disposed in the cup 43. A driving device 44a drives the wafer holding device 44 for rotation. An exhaust line 45 has one end connected to the bottom wall of the cup 43 and the other end connected to an exhaust device, not shown. The exhaust line 45 is provided with a gas-liquid separator. Three support pins 46 support a wafer W and move vertically. Indicated at 46a is a support pin lifting member holding the support pins 46 and at 46b is a lifting mechanism.

The substrate cleaning system 4 includes a cleaning liquid pouring nozzle 5 for pouring a cleaning liquid onto the surface of a wafer W and a gas nozzle 6 for jetting, for example, an inert gas at the surface of the wafer W. As shown in FIG. 5, the cleaning liquid pouring nozzle 5 has a nozzle body 51 of a shape resembling a rectangular tube having an oblique lower part 51a having a nozzle exit 52 of a shape resembling a slit. The cleaning liquid is poured obliquely onto the surface of the wafer W through the nozzle exit 52. The nozzle exit 52 may be a longitudinal arrangement of a plurality of small, circular holes formed in the lower part 51a of the nozzle body 51 instead of the nozzle exit having of a shape resembling a slit.

As shown in FIG. 5, a cleaning liquid supply pipe 53 is connected to the top wall of the nozzle body 51. As shown in FIG. 3, the cleaning liquid supply pipe 53 is connected through liquid supply control system 54 including a flow regulator to a cleaning liquid source 55 that supplies a cleaning liquid, such as pure water.

Referring to FIG. 6, a bracket 51b projecting from the back surface of the nozzle body 51 of the cleaning liquid pouring nozzle 5 is pivotally joined to an arm 56. Thus the nozzle body 51 can be turned about a vertical axis on the arm 56 to adjust the direction thereof. The arm 56 is bent in an L-shape. A first driving device 57 moves the arm 56 linearly along a guide rail 57a extended in a direction X in a bottom part of the case 41. The arm 56 can be vertically moved by a lifting mechanism. It is supposed herein that the first driving device 57 includes both a mechanism for moving the arm 56 in directions X and a lifting mechanism for simplicity.

The nozzle exit 52 of the cleaning liquid pouring nozzle 5 can be moved from a position corresponding to a central part of the wafer W held by the wafer holding device 44 by suction to a position corresponding to the circumference of the wafer W by moving the arm 56 in the direction X. The nozzle body 51 is connected to the arm 56 such that the nozzle exit 52 is directed slightly in the clockwise direction, in which the wafer W is rotated, with respect to the direction X.

The construction of the gas nozzle 6 is similar to that of the cleaning liquid pouring nozzle 5 shown in FIGS. 5 and 6. The gas nozzle 6 is attached to an arm 66 that moves in the directions X and in vertical directions. The arm 66 differs from the arm 56 in being capable of moving in directions Y. For example, as shown in FIG. 7, a lifting mechanism 67c for vertically moving the L-shaped arm 66 is combined with a Y-direction moving member 67b mounted on an X-direction moving member 67a that moves along the guide rail 57a so as to be movable in directions Y. A second driving device 67 shown in FIG. 4 includes, in combination, both a mechanism for moving the arm 66 in the directions X and Y and the lifting mechanism 67c. A mechanism for moving the gas nozzle 6 in the directions Y may be combined with the arm 66. Shown in FIGS. 3 and 7 are a nozzle body 61, a nozzle exit 62, a gas supply pipe 63, gas supply control system 64 and a gas source 65 that supplies an inert gas, such as nitrogen gas.

Referring to FIG. 4, a controller 100 including a computer provides control signals for controlling the driving devices 57 and 67, the driving device 44a for driving the wafer holding device 44, the cleaning liquid supply system 54 and the gas supply control system 64 according to a program stored in a storage device.

Figure 8:
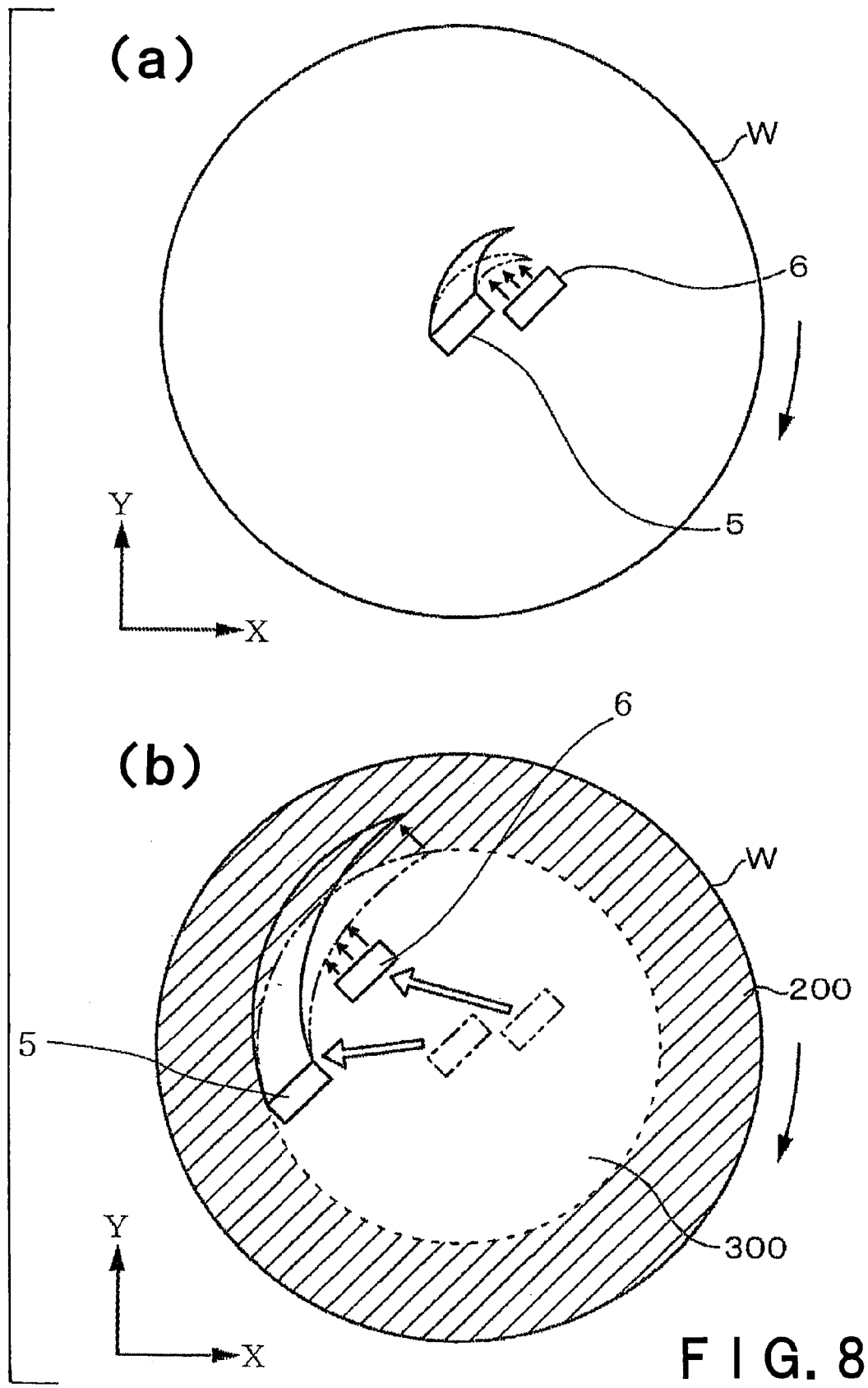
FIG. 8 is a view of assistance in explaining a wafer cleaning process using the substrate cleaning device in the first embodiment.

The operation of the substrate cleaning device 4 in the first embodiment will be described. The shutter 42 is opened, the second substrate carrying device 31B (FIG. 1) supporting a wafer W processed by an immersion exposure process advances into the case 41. The support pins 46 are raised and lowered to transfer the wafer W from the second substrate carrying device 31B to the wafer holding device 44. The second substrate carrying device 31B is retracted and the shutter 42 is closed. Then, the arm 56 is moved to locate the cleaning liquid pouring nozzle 5 at a position corresponding to a central part of the wafer W, more specifically, the center of the wafer W as shown in FIG. 8(a). As mentioned above, the nozzle exit 52 is directed slightly in the clockwise direction, in which the wafer W is rotated, with respect to the direction X.

Then, the arm 66 is moved to locate the nozzle exit 62 of the gas nozzle 6 at a position slightly behind the position of the nozzle exit 52 of the cleaning liquid pouring nozzle 5 with respect to the moving direction of the cleaning liquid pouring nozzle 5 and the gas nozzle 6 and with respect to the rotating direction of the wafer W, i.e., on the right side of the position of the nozzle exit 52 in FIG. 8(a).

The wafer W is rotated clockwise at a rotating speed not higher than 500 rpm, for example at 200 rpm and the cleaning liquid poured through the nozzle exit 52 of the cleaning liquid pouring nozzle 5 at a pouring rate of 250 ml/min. The cleaning liquid is poured from obliquely above the wafer W in a narrow strip onto a region including the center of the wafer W. At the same time, nitrogen gas is jetted through the nozzle exit 62 of the gas nozzle 6. Since the wafer W is rotated clockwise, a centrifugal force causing the cleaning liquid poured onto the wafer W to expand radially and a force causing the cleaning liquid to turn together with the wafer W acts on the cleaning liquid. Consequently, the cleaning liquid flows in a spiral flow on the wafer W. An ear-shaped figure indicated by two-dot chain lines in FIG. 8(a) represents the flow of the cleaning liquid on the wafer W immediately after the cleaning liquid has been poured onto the center of the wafer W through the cleaning liquid pouring nozzle 5 when any gas is not jetted through the gas nozzle 6.

Nitrogen gas is jetted through the gas nozzle 6 at a region behind the region onto which the cleaning liquid is poured at a jetting rate of, for example, 5 l/min in a radially outward direction. Consequently, the ear-shaped flow of the cleaning liquid is pushed radially outward. The cleaning liquid pouring nozzle 5 is moved in the direction X in which the cleaning liquid is poured out, i.e., to the left as viewed in FIG. 8(a), at a moving speed of 15 mm/s and the gas nozzle 6 is moved in substantially the same direction as the cleaning liquid pouring nozzle 5 at a moving speed equal to that of the cleaning liquid pouring nozzle 5. At the same time, the second driving device 67 moves the gas nozzle 6 nearly in the direction Y and in a direction in which the gas is jetted, i.e., the gas nozzle 6 is moved forward. Consequently, the distance between a region on which the cleaning liquid is poured and a region at which the nitrogen gas is jetted increases toward the circumference of the wafer W.

FIG. 8(b) shows the state of the cleaning liquid when the cleaning liquid pouring nozzle 5 pouring out the cleaning liquid and the gas nozzle 6 jetting nitrogen gas moved in the directions mentioned above. As shown in FIG. 8(b), the gas nozzle 6 moving toward the circumference of the wafer W jets nitrogen gas in a radially outward direction at the cleaning liquid poured onto the wafer W through the cleaning liquid pouring nozzle 5 moving toward the circumference of the wafer W and extending in an ear-shape in a clockwise direction so as to push the cleaning liquid radially outward. Consequently, an annular wet region 200 coated with a cleaning liquid film is formed on the wafer W, a dry region 300 demarcated by the inner circumference of the wet region 200 expands radially. Eventually, the dry region 300 extends over the entire surface of the wafer W to complete a cleaning process.

Upon the arrival of the cleaning liquid pouring nozzle 5 and the gas nozzle 6 respectively at positions corresponding to the circumference of the wafer W, the nozzles 5 and 6 are raised and are retracted from a space extending over the cup 43. Then, the second substrate carrying device 31b carries out the wafer W from the substrate cleaning device 4.

FIG. 9 shows the positional relation between the cleaning liquid pouring nozzle to and the gas nozzle 6. In FIG. 9, letters C, P and Q indicate the center of the wafer W, the center of the nozzle exit 52 of the cleaning liquid pouring nozzle 5 and the position of the upper end of the flow of nitrogen gas jetted through the gas nozzle 6 with respect to the rotating direction of the wafer W, respectively. Preferably, the angle PCQ, namely, angle θ, is 10° or above. If the angle θ is below 10°, the gas nozzle 6 is to close to a position onto which the cleaning liquid pouring nozzle 5 pours the cleaning liquid. Consequently, the cleaning liquid poured onto the wafer W is splashed in small drops by the gas jetted through the gas nozzle 5 and it is possible that the small drops of the cleaning liquid remain on the wafer W. If the angle θ is excessively large, the gas impinges on a thin film of the cleaning liquid and cannot effectively push the film of the cleaning liquid radially outward. Therefore, it is preferable to determine the angle θ selectively on the basis of relevant parameters including the rotating speed of the wafer W.

When the cleaning liquid pouring nozzle 5 is moved such that a region onto which the cleaning liquid is poured shifts from the central part toward the circumference of the wafer W and the wafer W is rotated at a low rotating speed of, for example, 500 rpm or below, the dry region expands at a low expansion rate because the centrifugal force acting on the film of the cleaning liquid is low and it is possible that drops of the cleaning liquid remain on the wafer W. The substrate cleaning device 4 in the first embodiment blows nitrogen gas radially outward at a region on the downstream side of a region onto which the cleaning liquid is poured with respect to the rotating direction of the wafer W. Consequently, the nitrogen gas exerts a force radially outward on a film of the cleaning liquid formed shortly after the cleaning liquid has been poured onto the wafer W to force the cleaning liquid flowing in a circumferential direction to move radially outward and hence a dry region on the surface of the wafer W expands quickly radially outward. Therefore, the cleaning liquid cannot remain on the surface of the wafer W, drops of the cleaning liquid can be surely removed and the cleaning process can be quickly completed.

There are not particular restrictions on the shape and direction of the nozzle exit 52 of the cleaning liquid pouring nozzle 5. The cleaning liquid pouring nozzle 5 held with the nozzle exit 52 directed radially outward and in a downstream direction with respect to the rotating direction of the wafer W is moved radially outward. Therefore the cleaning liquid is prevented from being splashed at a position onto which the cleaning liquid is poured and can flow in a mass in the rotating direction of the wafer W. Nitrogen gas blown at the mass of the cleaning liquid can very effectively force the cleaning liquid to move radially outward. The flow of the cleaning liquid poured out through the slit-shaped nozzle exit 52 can be stabilized.

The cleaning liquid pouring nozzle 5 and the gas nozzle 6 may be held in a fixed positional relation as shown in FIG. 10. Referring to FIG. 10, the gas nozzle 6 is held by a holding member 56a connected to the arm 56. The nozzle exits 52 and 62 are directed as mentioned above. The positional relation between the cleaning liquid pouring nozzle 5 and the gas nozzle 6 is substantially the same as that shown in FIG. 8(a). A driving device moves both the cleaning liquid pouring nozzle 5 and the gas nozzle 6.

Preferably, the gas nozzle 6 jets a gas passed through an ionizer. Usually, the cleaning liquid for cleaning the wafer W is pure water having a resistivity of, for example, 15 MΩ·m or above. When pure water discharged by pressure impinges strongly against the surface of a wafer W or against a water-repellent protective film formed on the surface of the wafer W before immersion exposure, static electricity is produced by friction to charge the wafer W at a potential of several kilovolts in some cases. When the cleaning water flows through a cleaning water supply pipe and a cleaning water pouring nozzle, static electricity is produced by friction between the cleaning water and the walls of the cleaning water supply pipe and the cleaning water pouring nozzle in some cases. If static electricity is produced, the cleaning water is charged and the wafer W is charged when the charged cleaning water is discharged onto the wafer W. The charged wafer W attracts particles, the charged wafer W cannot be satisfactorily processed by an exposure process and electric discharge that may occur during immersion exposure affect the protective film adversely.

Thus it is preferable to blow a gas passed through an ionizer at the surface of the wafer W. Basically, an ionizer generally called a static eliminator ionizes a gas into equal quantities of positive and negative ions. When the ionized gas comes into contact with a charged article, ions of the same polarity repulse each other and ions of opposite polarities attract each other. Consequently, static electricity is removed from the charged article.

Figure 11:
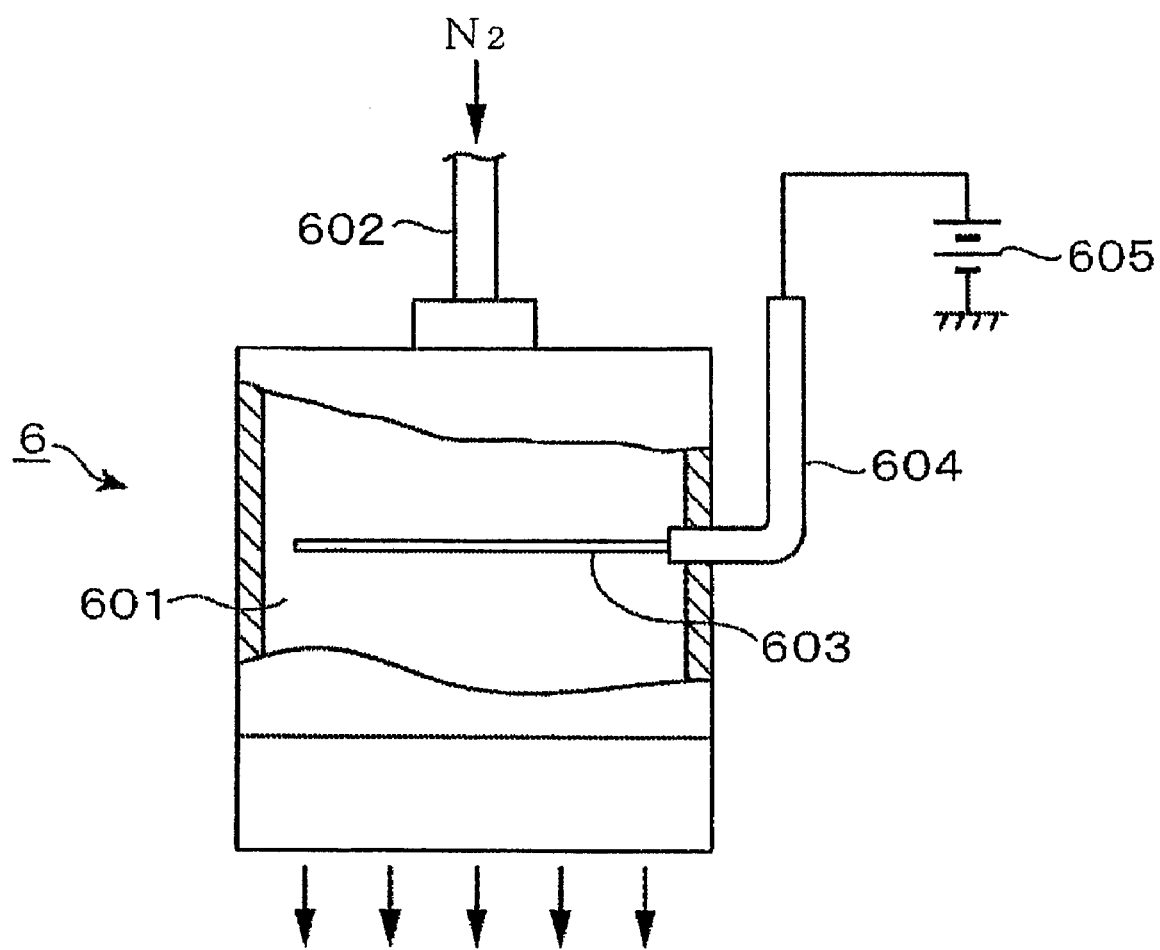
FIG. 11 is a longitudinal sectional view of a gas nozzle in a modification.
Figure 16:
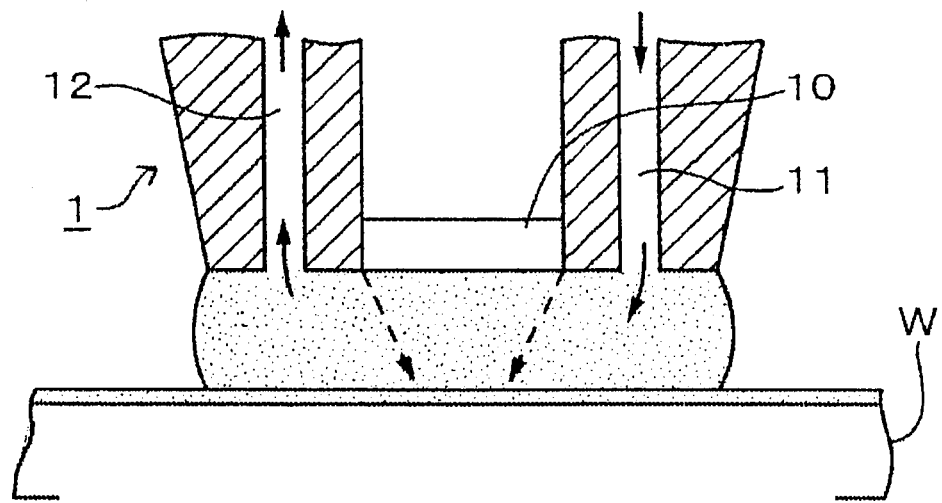
FIG. 16 is a sectional view of assistance in explaining an exposure system capable of carrying out immersion exposure.
Figure 17:
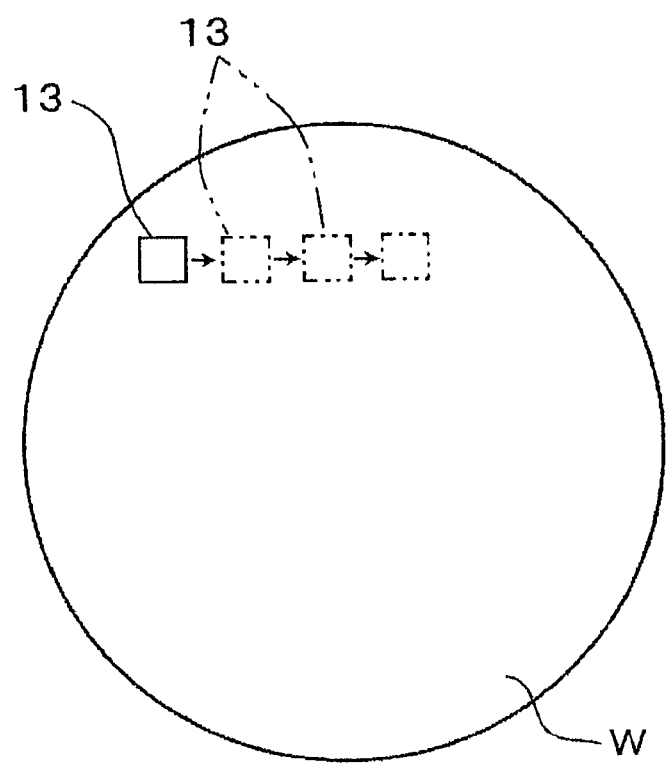
FIG. 17 is a view of assistance in explaining an immersion exposure process for processing a surface of a wafer by the exposure system.

FIG. 11 shows a gas nozzle 6 having a nozzle body 601 provided with an ionizer. A gas supply line 602 is connected to the nozzle body 610. The nozzle body 601 is provided with an electrode 603 serving as an ionizer. The electrode 603 is connected to a dc power supply 605 by a cable 604, namely, a power feed line. The electrode 603 may include a plurality of electrode bars extended and arranged across a gas passage so that the gas flowing through the nozzle body 601 can efficiently come into contact with the electrode bars. The gas flowing through a nonuniform electric field created around the electrode 603 is ionized. The ionizer may be placed in any space through which the gas flows. For example, the ionizer may be placed in the gas supply line 602 extending between the gas nozzle 6 and the gas source.

As shown in FIG. 12(a), the substrate cleaning device 4 may be provided with a nitrogen gas blowing device 201 provided with an ionizer at a position above the gate formed in the case 41. The gas blowing device 201 is provided with gas jetting holes arranged in a length corresponding to the width of a substrate, or the diameter of a substrate when the substrate is a wafer to blow the ionized gas ionized by the ionizer over the entire surface of the wafer W moving blow the nitrogen gas blowing device 201. The term, "ionizer" signifies an ionizing electrode. Referring to FIG. 12(b) showing the gas blowing device 201, nitrogen gas, for example, flowed through a gas supply line 203 into a gas chamber 202 is ionized by an ionizer disposed in the gas chamber 202, and the ionized nitrogen gas is blown through a lower nozzle part 204.

A substrate cleaning device in a second embodiment according to the present invention will be described. The substrate cleaning device in the second embodiment is provided with a cleaning liquid pouring nozzle 5 provided with a damming member for damming the flow of a cleaning liquid. The damming member is on the downstream side of the nozzle exit of the cleaning liquid pouring nozzle 5 with respect to the rotating direction of a wafer W. FIG. 13 is a perspective view of the cleaning liquid pouring nozzle 5 taken from below the cleaning liquid pouring nozzle 5. FIG. 14 is a plan view of an essential part of the cleaning liquid pouring nozzle 5 disposed on the wafer W. The cleaning liquid pouring nozzle 5 has a nozzle body 51 having a rectangular bottom wall 70. A substantially V-shaped recess 71 opening in a direction in which the cleaning liquid pouring nozzle 5 is moved. A nozzle exit 73 is formed in a base part of the top wall 72 of the recess 71.

A wall 74 extends from the recess 71 at a level below that of the recess. The top wall 72 of the recess 71 and the wall 74 are called herein a first damming wall and a second damming wall, respectively. In the cleaning process, the cleaning liquid pouring nozzle 5 is held such that the first damming wall 72 and the second damming wall 74 are at 1 mm and 2 mm, respectively from the surface of a wafer W.

The cleaning liquid pouring nozzle 5 is held with the open end of the recess 71 facing the circumference of a wafer W as shown in FIG. 14 and is moved toward the circumference of the wafer W in a manner as mentioned in connection with the description of the substrate cleaning device 4 in the first embodiment. A cleaning liquid poured out through the nozzle exit 73 is caused to flow in an ear-shaped flow by the agency of centrifugal force and force causing the cleaning liquid to flow in a circumferential direction. Thus the cleaning liquid is spread in an annular shape on the surface of the wafer W. The first damming wall 72 and the second damming wall 74 dam the cleaning liquid in steps as shown in FIG. 15. Consequently, the cleaning liquid L (FIG. 13) tends to stagnate in a mass, a high centrifugal force acts on the mass of the cleaning liquid L to force the cleaning liquid L to flow rapidly toward the circumference of the wafer W, and a dry region on the surface of the wafer W expands rapidly toward the circumference of the wafer W. Thus the cleaning liquid does not stagnate at the same radial position, drops of the cleaning liquid can be surely removed and the cleaning process can be quickly completed.

According to the present invention, a damming wall may be disposed at the same height as the nozzle exit 73 at a downstream side of the nozzle exit 73 with respect to the rotating direction of the wafer W. When a damming structure as shown in FIG. 13 is employed, the cleaning liquid poured out through the nozzle exit 73 is constrained to stay in the recess 71 and centrifugal force forces a mass of the cleaning liquid constrained to stay in the recess 73 to flow out through the open end of the recess 71 and the laterally flowing cleaning liquid is held by the second damming wall 74. Consequently, a high constraining force acts on the cleaning liquid and a high force acts on the cleaning liquid to force the cleaning liquid to flow outward.

Although the two damming walls are disposed in two steps in this embodiment, a damming means may be a continuous inclined wall declining downstream with respect to the rotating direction of the wafer.

Although the substrate cleaning device in the second embodiment does not need necessarily to be provided with the gas nozzle 6, the second embodiment may be combined with the first embodiment. For example, the cleaning liquid pouring nozzle 5 shown in FIG. 13 may be employed in the substrate cleaning device in the first embodiment shown in FIGS. 3 and 4. When the substrate cleaning device in the first embodiment is provided with the cleaning liquid pouring nozzle 5 shown in FIG. 13, the respective effects of the gas nozzle 6 and the cleaning liquid pouring nozzle 5 in forcing the cleaning liquid to flow radially outward are combined and an action to move the cleaning liquid rapidly radially outward is enhanced. Preferably, the gas nozzle 6 provided with an ionizer as shown in FIG. 11 is used.

The substrate cleaning device according to the present invention can be used not only for cleaning a substrate after immersion exposure, but also for cleaning a substrate before immersion exposure.

What is claimed is:

1. A substrate cleaning device comprising:
   a rotary substrate holding device that horizontally holds a substrate;
   a cleaning liquid pouring nozzle that pours a cleaning liquid onto a surface of a substrate held by the rotary substrate holding device; and
   a driving device that moves the cleaning liquid pouring nozzle while the substrate is being rotated so that a region on the surface of the substrate onto which the cleaning liquid poured through the cleaning liquid pouring nozzle moves from a central part toward a circumference of the substrate,
   wherein the cleaning liquid pouring nozzle has a portion which faces the surface of the substrate, the portion of the cleaning liquid pouring nozzle comprises
   a recess having an opening open toward the circumference of the substrate and a V-shape in a plane view having a broader width toward the circumference of the substrate, the recess being formed of a top wall and a side wall standing from an edge of the top wall and surrounding the top wall so as to form the opening,
   a nozzle opening for pouring the cleaning liquid onto the substrate, formed on the top wall of the recess, and
   a liquid damming member, for damming the cleaning liquid poured out through the nozzle opening onto the substrate,
   the liquid damming member being composed of
   a first portion surrounding the recess, including the top wall and the side wall, and
   a second portion extending from an edge of the side wall at a height lower than that of the nozzle opening.

2. The substrate cleaning device according to claim 1, wherein the height of the liquid damming member decreases gradually in the rotating direction of the substrate.

3. The substrate cleaning device according to claim 1, wherein the substrate is at a stage after being processed by an immersion exposure process that coats the surface of the substrate with a liquid for exposure and before being subject to a heating process.

4. The substrate cleaning device according to claim 1, wherein the substrate is rotated at a rotating speed of 500 rpm or below.

5. The substrate cleaning device according to claim 1, wherein the recess is substantially V-shaped in a direction in which the cleaning liquid pouring nozzle is moved.

6. The substrate cleaning device according to claim 1, wherein the top wall is at about 2 mm from the surface of the substrate, and the second portion is at about 1 mm from the surface of the substrate.

* * * * *